(12) United States Patent
Silve

(10) Patent No.: US 6,836,753 B1
(45) Date of Patent: Dec. 28, 2004

(54) CONE SLACK ALLOCATOR FOR COMPUTING TIME BUDGETS

(75) Inventor: Francois Silve, Mouans-Sartoux (FR)

(73) Assignee: Cadence Design Systems, Inc., San Jose, CA (US)

( * ) Notice: Subject to any disclaimer, the term of this patent is extended or adjusted under 35 U.S.C. 154(b) by 534 days.

(21) Appl. No.: 09/880,333

(22) Filed: Jun. 13, 2001

(51) Int. Cl.[7] ............................................. G06F 17/50
(52) U.S. Cl. .............................. 703/2; 703/13; 716/9; 716/6
(58) Field of Search ............................ 703/2, 14, 19; 716/6, 8, 9, 14, 12, 7

(56) References Cited

U.S. PATENT DOCUMENTS

| | | | |
|---|---|---|---|
| 3,617,714 | A | 11/1971 | Kernighan et al. |
| 4,593,363 | A | 6/1986 | Burstein et al. |
| 4,612,618 | A | 9/1986 | Pryor et al. |
| 4,630,219 | A | 12/1986 | DiGiacomo et al. |
| 4,924,430 | A | 5/1990 | Zasio et al. |
| 5,053,980 | A | 10/1991 | Kanazawa |
| 5,095,454 | A | 3/1992 | Huang |
| 5,111,413 | A | 5/1992 | Lazansky et al. |
| 5,144,563 | A | 9/1992 | Date et al. |
| 5,187,784 | A | 2/1993 | Rowson |
| 5,197,015 | A | 3/1993 | Hartoog et al. |
| 5,218,551 | A | 6/1993 | Agrawal et al. |
| 5,224,056 | A | 6/1993 | Chene et al. |
| 5,237,514 | A | 8/1993 | Curtin |
| 5,239,493 | A | 8/1993 | Sherman |
| 5,251,197 | A | 10/1993 | Leube et al. |
| 5,426,591 | A | 6/1995 | Ginetti et al. |
| 5,461,576 | A | 10/1995 | Tsay et al. |
| 5,475,607 | A | 12/1995 | Apte et al. |
| 5,483,461 | A | 1/1996 | Lee et al. |
| 5,521,837 | A | 5/1996 | Frankle et al. |
| 5,778,216 | A | 7/1998 | Venkatesh |
| 6,378,116 | B1 * | 4/2002 | Ginetti ............................ 716/7 |
| 6,480,991 | B1 * | 11/2002 | Cho et al. ........................ 716/8 |
| 6,622,291 | B1 * | 9/2003 | Ginetti ............................ 716/9 |

OTHER PUBLICATIONS

Venkatesh, S.V. (1995) "Hierarchical Timing–driven Floorplanning and Place and Route Using a Timing Budgeter," *IEEE 1995 Custom Integrated Circuits Conference* pp. 469–472.

Frankle, Jon (1992) "Iterative and Adaptive Slack Allocation for Performance–driven Layout and FPGA Routing," *29th ACM/IEEE Design Automation Conference* pp. 536–542.

Ikeda, Toshio et al. (1992) "aTAPLAS3: A Constraint Driven and High–performance Layout System for Huge Design," *IEEE 1992 Custom Integrated Circuits Conference* pp. 28.5.1 –28.5.4.

Hitchcock, Robert B. et al. (1982) "Timing Analysis of Computer Hardware," *IBM J. Res. Develop.* 26(1):100–105.

Hauge, Peter S. et al. (1987) "Circuit Placement for Predictable Performance," *IEEE International Conference on Computer–Aided Design* pp. 88–91.

(List continued on next page.)

*Primary Examiner*—Thai Phan
(74) *Attorney, Agent, or Firm*—John W. Carpenter; Reed Smith LLP

(57) ABSTRACT

Timing slack is allocated to edges of a timing graph by a converging loop that calls a Domain Restricted Timing Cone (DRTC) iterator. The DRTC iterator invokes a kernel program for each DRTC and computes time budgets for each edge. The time budgets are kept within established constraints of the corresponding DRTC. A timing verifier computes an amount of slack for each edge based on the time budget. An edge or arc of the timing graph is made permanent when the slack is less than a predetermined epsilon. The kernel program is based on any of a fast estimate, consideration of all time to end point (tte) and weight to endpoint (wte) pairs within the graph, and/or a set of tte wte pairs (or an envelope) that represent segments of a lowest slack to weight ratio.

31 Claims, 8 Drawing Sheets

OTHER PUBLICATIONS

Garbers, J. et al. (1990) "VLSI–Placement on Routing and Timing Information," *EDAC Proceedings of the European Design Automation Conference* pp. 317–321.

Shragowitz, E. et al. (1988) "Predictive Tools in VLSI System Design: Timing Aspects," *CompEuro 88 — System Design: Concepts, Methods and Tools* pp. 48–55.

Sutanthavibul, S. et al. (1991) "Dynamic Prediction of Critical Paths and Nets for Constructive Timing–Driven Placement," *28th ACM/IEEE Design Automation Conference* pp. 632–635.

Kernighan, B.W. et al. (1970) "An Efficient Heuristic Procedure for Partitioning Graphs," *The Bell System Technical Journal* pp. 291–307.

Quinn, Jr., et al. (1979) "A Forced Directed Component Placement Procedure for Printed Circuit Boards," *IEEE Transactions on Circuits and Systems* CAS–26(6):377–388.

Teig, Steven et al. (1986) "Timing–Driven Layout of Cell–Based Ics," *VLSI System Design* VII(5):63–73.

Dunlop, A.E. et al. (1984) "Chip Layout Optimization Using Critical Path Weighting," *21st Design Automation Conference* pp. 133–136.

Sarrafzadeh, M. et al. (1997) "A Delay Budgeting Algorithm Ensuring Maximum Flexibility in Placement," *IEEE Transactions on Computer–Aided Design of Integrated Circuits and Systems* 16(11):1332–1341.

Nair, R. et al. (1989) "Generation of Performance Constraints for Layout," *IEEE Transactions on Computer–Aided Design* 8(8):860–874.

Youssef, Habib et al. (1992) "Bounds on Net Delays for VLSI Circuits," *IEEE Transactions on Circuits and Systems — II: Analog and Digital Signal Processing* 39(11):815–824.

* cited by examiner

A sample circuit with its associated timing graph

Illustration of a Timing Cone in the edge graph.

DRTC traversal terminology

CONE SLACK ALLOCATOR FOR COMPUTING TIME BUDGETS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of Invention

The present invention relates to the computation of time budgets. The present invention is more specifically related to the field of Computer-Aided Design (CAD) tools for automating the design and verification of electronic systems and circuits, and particularly the computation of time budgets.

2. Discussion of Background

Transistor placement (cells) and wire routing (nets) of a circuit design on a substrate has become an important area for computer-aided design (CAD). Advances in circuit integration have made it possible for circuit designers to incorporate designs having more than a million transistors on a single chip. Even using advanced CAD based approaches to place and route (P&R), circuit designs are complicated and both time and computationally intensive. Faster clock cycles and critical path constraints make the traditional process even more complicated.

A typical design process includes having a user design a logic circuit, and then direct a computer to program a logic device or to design a set of masks to implement the desired logic design. Timing of signals passed between parts of the logic device depends in part upon placement of the user's circuit elements into transistor groups in the physical structure and the resultant arrangement of the metal wires. In general, longer wires mean longer delays, but the actual timing is also heavily dependent upon capacitances, resistances, which vary based on placement and proximity to other wires and circuit elements, and the number of logic elements a signal must traverse. In addition, as transistors have become faster, a larger percentage of the delay in passing a signal through the device is contributed by the wiring. Therefore it has become a worthwhile effort to select wiring segments carefully to minimize the delay caused by these wiring segments.

One problem is computing the net delay upper bounds. This problem consists of transforming design-level timing constraints (such as clock period) into local net delay constraints. These local net delay constraints are then used by the placer to do a timing driven placement, so they play a very important role in the final layout and performance. This problem has been already explored in the past, and there are some existing algorithms: Zero Slack Algorithm (ZSA), "Generation of Performance Constraints for Layout" Nair and co IEEE CAD 1989, MIMP, "Bounds on Net Delays for VLSI Circuits" Habib Youssef and co IEEE Transactions on Circuits and Systems November 1992, and LBA, "Iterative and Adaptative Slack Allocation for Performance-Driven Layout and FPGA Routing" Jon Frankle DAC92.

Another previous system is described in "A Delay Budgeting Algorithm Ensuring Maximum Flexibility in Placement," M. Sarrafzadeh, D. A. Knol, G. E. Tellez, IEEE transactions on CAD of Integrated Circuits and Systems November 1997. The method described here uses a Linear Programming formulation. However none of the above systems provide an optimal solution.

SUMMARY OF THE INVENTION

The present inventors have realized that existing solutions for determination of net delay constraints and budgets are inadequate. This invention presents a new approach to the problem of computing the net delay upper bounds.

The present invention is embodied as a method of computing a time budget for each edge in a Domain Restricted Timing Cone (DRTC) of a graph, comprising the steps of, determining timing constraints including a required output time (R) for an endpoint of the DRTC and an arrival time (Ai) for each input (i) of the DRTC, decorating each vertex in the graph with a time to endpoint (tte) value and a weight to endpoint (wte) value, tte representing a longest time to reach the endpoint and wte representing a largest sum of weight to reach the endpoint, computing a smallest slack to weight on each edge of the graph within the DRTC using the tte and wte pair for each edge.

The present invention also includes a method for performing analysis on a set of domain- restricted timing cones, comprising the steps of, selecting a domain restricted timing cone, determining a slack to weight ratio for each edge in the domain restricted timing cone, for each edge, if the determined slack to weight ratio for an edge is less than a current slack to weight ration for that edge, then, replacing the current slack to weight ratio with the current slack to weight ratio, and selecting a next domain restricted timing cone and repeating said steps of determining and replacing until each timing cone has been analyzed.

The present invention also includes A method of slack allocation within a timing graph, comprising the steps of, setting an initial edge time for each edge in the timing graph, and iteratively performing the following steps, computing an amount of the available slack to be budgeted to each edge of the graph, for each edge having a weight greater than zero, if the computed slack is greater than a predetermined epsilon, then restore the edge time to that in an immediately preceding iteration, and if the computed slack is less than or equal to the predetermined epsilon, then saving a current edge time and setting a weight of the edge to zero, stopping the iterative steps if an amount of slack to allocate is less than the predetermined epsilon, determining a new budget for each edge, and incrementing the edge time for each edge by the corresponding new budget, until the iterative steps are stopped or a maximum number of iterations is performed.

The invention may be embodied in a device and both the device and/or method may be conveniently implemented in programming on a general purpose computer, or networked computers, and the results are intended to be input to other devices or processes, such as timing driven placement, optimization, and so on, with the very end goal being to produce a chip. However, the results may also be displayed on an output device connected to any of the general purpose, networked computers, or transmitted to a remote device for output or display. In addition, any components of the present invention represented in a computer program, data sequences, and/or control signals may be embodied as an electronic signal broadcast (or transmitted) at any frequency in any medium including, but not limited to, wireless broadcasts, and transmissions over copper wire(s), fiber optic cable(s), co-ax cable(s), and opto-electric devices, etc.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Although many examples and discussion herein are directly related to computation of net delays, the reader is reminded that the overall processes discussed herein are directed to computing time budgets, and the computation of these budgets for nets is one application of the invention. In other applications, it makes sense to compute budgets for a set of instances and/or nets. For example, a designer may consider a particular Verilog module in a design, and compute budgets for this module, meaning the delay that the electrical signal can spend crossing this particular Verilog module. Such time budgets can be used to optimize the Verilog module: the optimizer knows how fast the module should be, and improves the structure until the Verilog module delay is less than the Verilog module budget.

For a more complete understanding of the problems addressed by the present invention, we first review the basic concept of correct or bad budgets in the context of calculating net delays for circuit design applications. The notion of correct/bad budgets is defined as the fidelity to the weights specified on the associated timing graph edges.

Figure 1:
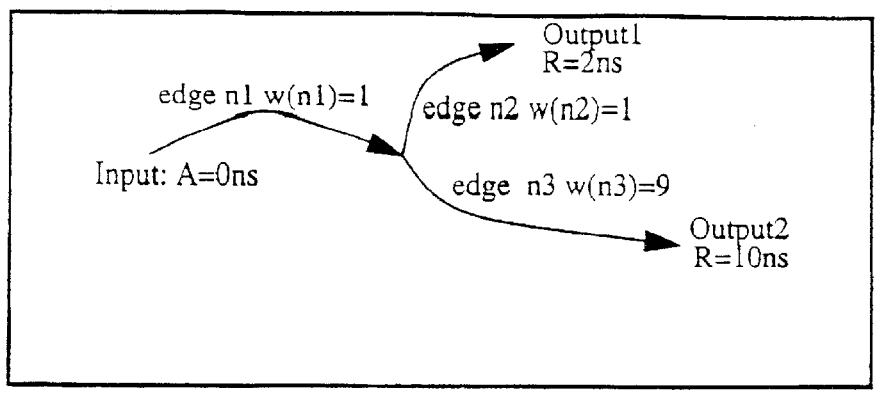
FIG. 1 is a timing graph.

Referring now to the drawings, wherein like reference numerals designate identical or corresponding parts, and more particularly to FIG. 1 thereof, there is illustrated a timing graph having edges between an input, outputs and a vertex. In FIG. 1, weights specified on edges n1 and n2 are equal which suggests the relation $B(n1)=B(n2)$, where $B(n)$ is a computed budget for edge "n".

The weights specified on edges n1 and n3 are such that $w(n3)/w(n1)=9$, $w(n)$ being a function that computes weight for edge "n". The weight specification indicates that $B(n3)=9\ B(n1)$, with $B(n1)+B(n2)=2$ and $B(n1)+B(n3)=10$ one gets the following expected budgets:

$$B(n1)=1\text{ ns, }B(n2)=1\text{ns, }B(n3)=9\text{ ns}$$

A good time budgeter should find these values. The prior solutions are ZSA, MIMP, and LBA. The state of art solutions are MIMP and LBA. LBA is actually the same algorithm as MIMP in addition to providing how to choose edge weights in order to get a good timing driven placement. It does not improve the budget computation, given the edge weights.

The MIMP paper is introducing the Minimax problem formulation:

$$B(\text{edge})=\text{local weight}*\min(\text{path slack/path weight})$$

where the term path slack/path weight is computed for every path going through the considered edge.

This is of course NP-Hard, and the MIMP paper also introduces the Minimax-Pert formulation:

$$B(\text{edge})=\text{local weight}*\min(\text{edge slack})/\max(\text{path weight}).$$

Turning back now to the fundamentals of the present invention, a shortcoming with the Minimax-Pert formulation is that at each timing path divergence or convergence the term min(edge slack) may come from one branch, while the term max(path weight) may come from another branch. In FIG. 1, it makes the "apparent" slack to weight ratio of edge n1 equal to:

$$\min(\text{edge }n1\text{ slack})=2\text{ ns/max(path weight)}=10 ==> \text{slack to weight ratio}=0.2\text{ ns}$$

However, this apparent slack is incorrect because the true slack to weight ratio of n1 is 1 ns.

Continuing now with the present invention, we provide the following definitions:

Definitions

Timing Graph

A timing graph is an oriented graph {V,E} where V and E denote the set of vertices and edges in the graph. The vertices represent inputs and outputs of components within the circuit and inputs and outputs of the circuit itself. A vertex that represents a component output or a circuit input is called a driving vertex. A vertex that represents a component input or a circuit output is called a driven vertex.

There is one edge for each pair of connected vertices. Each edge has a source and a sink and is oriented from its source to its sink. Two vertices are connected when one of them is a driving vertex and the other a driven vertex and one of the following 2 cases is true:

1. The vertices are connected together by a wire in the circuit. In this case the edge source is the driving vertex and the edge sink is the driven vertex. The edge is said to be a net arc; or
2. The vertices belong to the same component in the circuit and this component has a combinational path from the corresponding input to the corresponding output. In this case the edge source is the driven vertex and the edge sink is the driving vertex. The edge is said to be a pin to pin arc.

Figure 2:
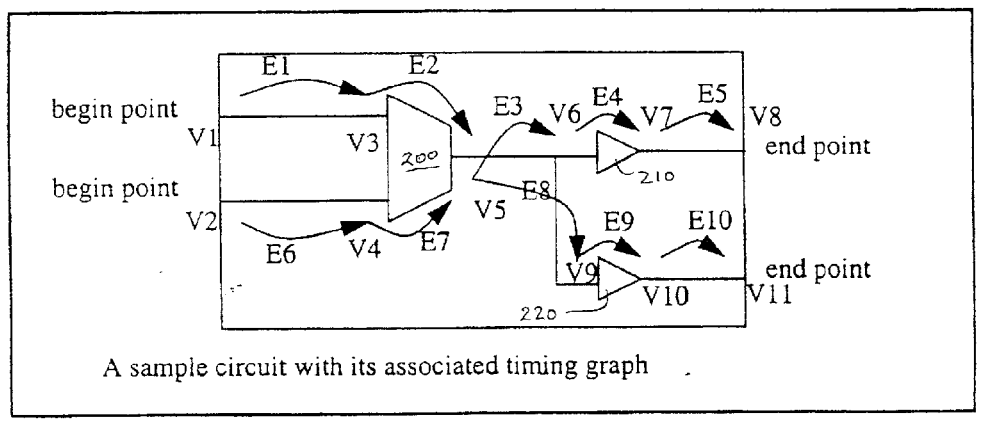
FIG. 2 is a timing graph that illustrates an example correspondence between a circuit and a timing graph.

Vertices that are not driven by any edge are called begin points. Vertices which do not drive any edge are called end points. FIG. 2 illustrates an example correspondence between a circuit (gates 200, 210, and 220, and associated nets) and a timing graph (E1–E10). Note that the bi-directional connectors in the circuit are represented by two vertices in the timing graph: one is a begin point and the other a end point.

Timing Path

A timing path is a loopfree connected set of edges and vertices that starts on a begin point and ends on a end point (the set of connected edges and vertices do not form a loop). For example, referring to FIG. 2, V1→E1→V3→E2→V5→E8→V9→E9→V10→E10→V11 is a timing path. A sum of time required for an electrical signal to traverse each edge in the timing path is referred to as a sum of edge time along the timing path (sum_of_edge_time_along_the_timing_path).

Timing Constraints

Timing constraints are limits on how much time the electrical signal can spend crossing the timing paths. Timing Constraints consist of:

1. An arrival time on the begin points which is the time at which propagation through a circuit represented by the timing graph starts (begin_point_arrival_time);

2. A required time on the end points which is the time at which the sinks must be reached (end_point_required_time); and 3. Some exceptions like lists of invalid paths (the time spent by the electrical signal going through those paths is ignored)

Timing Domain

A timing domain is a domain in which some timing constraints are defined. Each timing domain contains its own set of begin times, end times, and time exceptions.

Domain Restricted Timing Path Slack

This is the slack of a specified path within a specified timing domain. The slack is equal to the difference:

end_point_required_time—begin_point_arrival_time—sum_of_edge_time_along_the_timing_path Timing Path Slack This is the smallest slack among all the domain restricted path slacks of the specified path. Since the path can belong to different timing domains, the most constraining timing domain is the one that makes the timing path slack.

Vertex Slack

This is the smallest timing path slack among all the timing paths that go through the specified vertex.

Edge Slack

This one is usually defined as the smallest slack between its source vertex slack and its sink vertex slack. In this patent, we define edge slack as the largest slack between the source vertex slack and the sink vertex slack of the edge.

Goal

The goal is to compute the data described in subsection "Outputs", given the data described in subsection "Inputs".

Inputs

1. A static timing verifier which preferably provides at least the following services:

A timing graph (representing a given circuit) and the iterators to navigate through it;

An edge time computer (which uses data stored in technology descriptions, a database that contains all the characteristics of the technology needed to compute delay through gates and nets). The edge time computer computes the timing delay;

An edge set device to set edge times, and disable the edge time computer for corresponding edges. The edge set device allows the CSA to set timing arc delays, but not more than that computed by the edge time computer;

A representation of the timing domains and the timing constraints;

A vertex slack computer taking into account the edge times, the timing domains and constraints;

An iterator on timing domains. The iterator returns a reference for each timing domain;

A mechanism to get the begin point arrival times for a given timing domain;

A mechanism to get the end point required times for a given timing domain; and

A mechanism to query whether a timing path is valid or not within a given timing domain (according to the timing exceptions in this domain).

2. A weight $W(e)$ for each edge. The edge weight is a value (a float for example) that is associated with each edge. This value is an input for time budgeting. It is usually automatically computed by another program that is run prior to the time budgeting. As an example one can set the value "1" on all the edges. Another example would be to set "0" on the pin-to-pin arcs, and "1" on the net arcs—this would cause the budgeting to compute the net delay budgets, used as net delay upper bounds by a timing driven placer.

3. An initial time $IT(e)$ for each edge, and then an initial edge slack $IS(e)$ for each edge (computed by the static timing verifier).

Outputs

1. A time budget $B(e)$ for each edge;

2. A new time $T(e)$ for each edge such that $T(e)=IT(e)+B(e)$ and such that (for each edge);

3. If the initial slack $IS(e)$ is negative then its new slack is equal to it: $S(e)=IS(e)$; and 4. If the initial slack $IS(e)$ is positive then its new slack is null: $S(e)=0$.

Although the present invention is appropriately described where delays are only increased in order to decrease the positive slack until it becomes null, a contrary implementation is also possible. That is the delays are only decreased in order to increase the negative slack until it becomes null. In this new case, the output description in point 3 becomes: If the initial slack $IS(e)$ is negative, then $S(e)=$"0" and not $IS(e)$. The converging loop may be constructed of 2 steps: in one step the negative slack is increased until it becomes null, and in the second step, the positive slack is decreased until it becomes null.

Whether the positive slack is decreased or the negative slack is increased, the above process is preferably implemented in 2 separate passes, not in the same pass. When in positive mode, the edge weight of any edge that needs to go the negative way is set to 0. When in negative mode, the edge weight of any edge that needs to go the positive way is set to 0. Setting the edge weights to 0. is the way to switch in either the positive mode or the negative mode. When in negative mode (edge delays are decreased until negative slack becomes null), the slack to weight value "slack_to_weight(edge)=remaining_slack(edge)/remaining_weight (edge)" is a negative value because the remaining_slack (edge) is negative. In this case, the (tte,wte) pairs that are kept are not those that give the smallest value, but those that give the greatest value. This is because it is negative. One could also say that the (tte,wte) pairs that are kept are those that give the smallest absolute value. This also holds true for the "early" constraint case discussed further herein. The negative cases are particularly applicable if the "early" constraints are calculated.

Timing Cone

Figure 3:
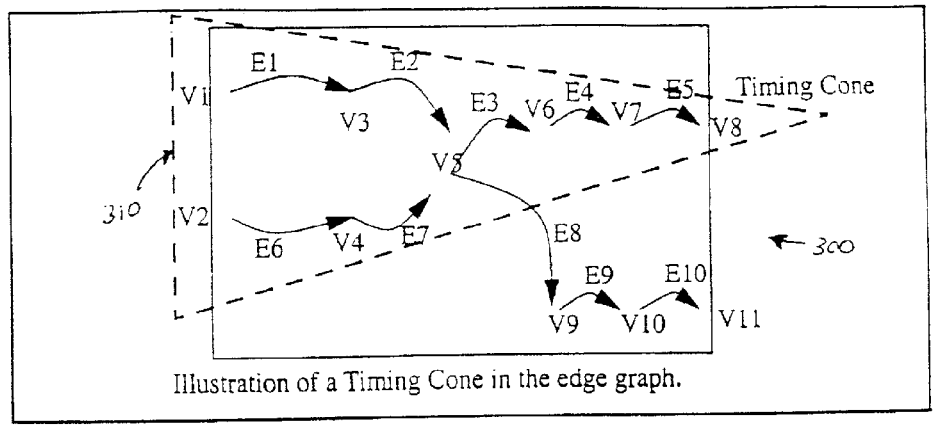
FIG. 3 is a timing/edge graph having edges and vertexes.

A timing cone is defined by an end point: The timing cone is a sub graph (within a current timing graph) that contains all the edges and vertices that are on any timing path ending on the end point. Referring to FIG. 3, an edge graph 300 contains edges E1 ... E10 and vertices V1 ... V11. An example timing cone 310 is illustrated at end point vertex V8 which contains all the edges and vertices ending at vertex V8.

Domain Restricted Timing Cone (DRTC)

This is a pair made of a timing cone and a list of timing domains. Actually one domain restricted timing cone is created for each end point and for each timing domain which does contain time exceptions. When no timing domain contains time exception there is one domain restricted timing cone per end point.

Description of the Cone Slack Allocator (CSA) Algorithm

The CSA algorithm is made of 3 level (top, intermediate, and low). The present invention includes processes/methods for performing each of these 3 levels that is described in the subsequent sections. The top level is called the Converging loop. The intermediate level is called the domain restricted timing cone iterator. The low level is called the Cone Slack Allocator kernel (CSA_kernel).

Figure 4A:
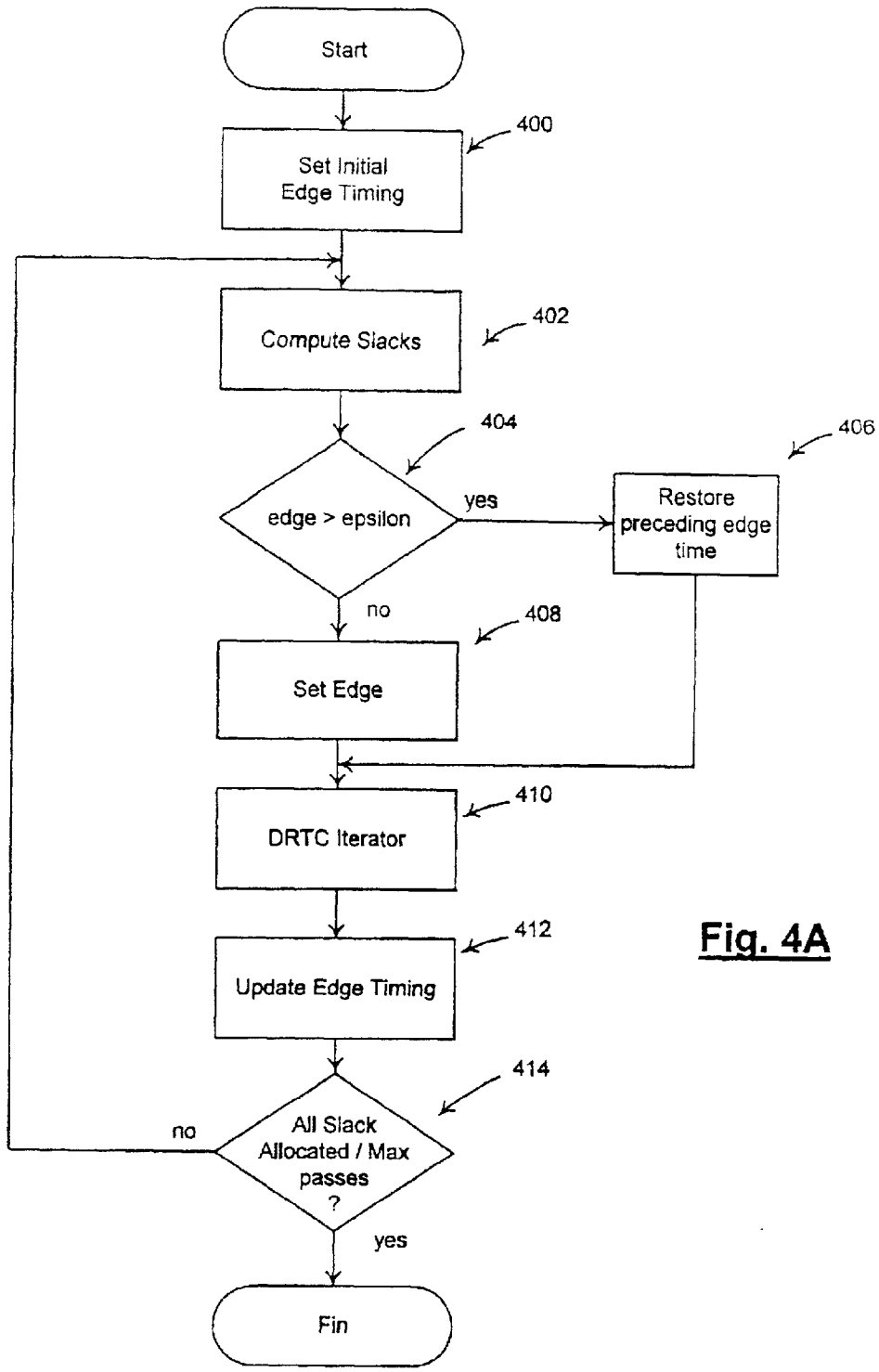
FIG. 4A is a high level flow chart of an embodiment of a converging loop according to the present invention.

FIG. 4A is a high level flow chart of an embodiment of a converging loop according to the present invention. The converging loop begins by setting an initial time for each edge and computing edge slacks (steps 400 and 402). If the edge slacks are greater than a predetermined epsilon, a preceding edge time is restored (step 406), otherwise the edge time is set (step 408), and then a Domain Restricted Timing Cone (DRTC) iterator is invoked (step 410). Using the results from the DRTC iterator, the edge times are updated (step 412), the slacks are recomputed and the process repeats until all the slacks are allocated or until a maximum number of passes is reached.

Figure 4B:
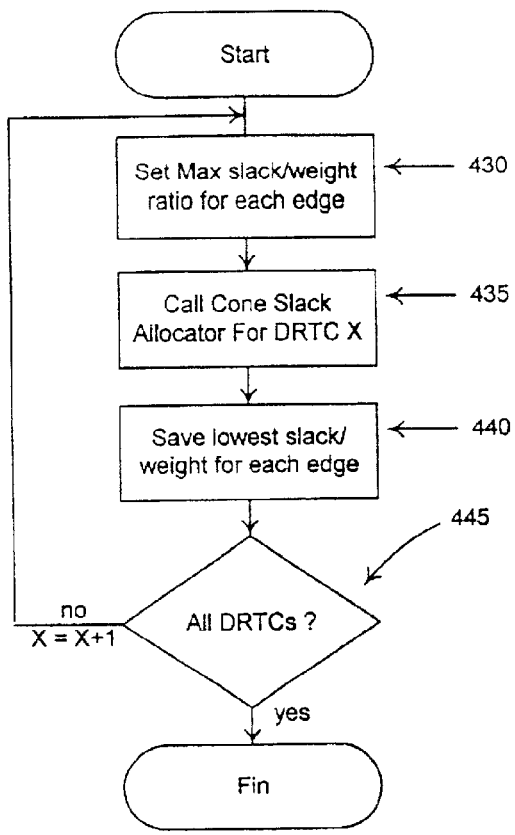
FIG. 4B is a high level flow chart of an embodiment of a method used by a Domain Restricted Timing Cone (DRTC) iterator according to the present invention.

FIG. 4B is a high level flow chart of an embodiment of a method used by a Domain Restricted Timing Cone (DRTC) iterator according to the present invention. The DRTC iterator begins by setting a max slack/weight ratio for each edge in the timing graph being analyzed (step 430), and then calls a Cone Slack Allocator (CSA) kernel for a DRTC within the timing graph (step 435). After analyzing the selected DRTC, the lowest slack to weight ratio for each edge is saved (step 440). On the first iteration, it is expected that each slack/weight ratio computed by the CSA_Kernel will be lower than the max slack/weight ratio set in step 430. On subsequent iterations, the slack/weight ratio will only be set if it is lower than the slack/weight ratio for that edge if it was set in a previous iteration. The iterator then calls the CSA kernel (step 440) for each DRTC (step 450). A next DRTC is selected and the process repeats until all DRTC's have been analyzed. Provisions may be made to skip or alter the order of DRTC evaluation based on any criteria, including exceptions to any timing contraints.

Figure 4C:
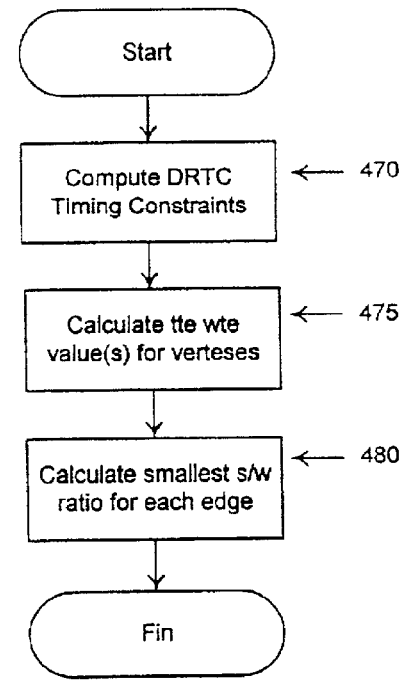
FIG. 4C is a high level flow chart of an embodiment of a Cone Slack Allocator (CSA) kernel method according to the present invention.

FIG. 4C is a high level flow chart of an embodiment of a Cone Slack Allocator (CSA) kernel method according to the present invention. At step 470, the timing constraints for the selected DRTC are determined. At step 475, time to endpoint (tte) and weight to endpoint (wte) are calculated and stored in relation to a corresponding vertex of the timing graph. And, at step 480, the smallest slack/weight ratio is calculated for each edge using the stored tte and wte values.

Thus, the CSA kernel computes a time budget for each edge in the DRTC, according to the DRTC timing constraints. The converging loop gets these time budgets, and converts them into edge time; it then sets them on the edges (The edge set device sets the timing arc delay. Once a delay has been set on an edge, the next slack calculation takes into account the new delay.) so that the timing verifier can compute the new edge slacks, taking into account the time budgets.

The present invention provides four different versions of the CSA_kernel method, a DRTC iterator and related processing, and a converging loop. Also discussed is a converging loop as previously described in the MIMP document referenced above. Now let us describe successively:

Iterators used by the CSA kernel to traverse the DRTC;

Four versions of CSA_kernel: CSA_Kernel_fast, CSA_kernel_all_pairs,

CSA_kernel_minimax, CSA_kernel_approximated_pairs;

A domain restricted time cone iterator; and

Two versions of the converging loop.

Iterations within the Domain Restricted Timing Cones

The CSA_kernel is traversing the DRTC several times using Depth First Search (DFS) and Breadth First Search (BFS) traversals. Depth first searching places nodes in a stack as it finds them. When it needs a node to search, it pulls one off the top of the stack. Thus, depth first search will look as "deep" as it can before trying alternatives. On the other hand, breadth first searching places nodes in a queue as it find them. When it needs a node to search, it takes one from the front of the queue. Thus, breadth first search will look at nodes in layers, and will always find the shortest path to the target.

The DFS and BFS traversals of graphs are well known algorithms, and the reader is directed to the published literature for additional information. Our discussion and implementation shown below is provided because they are used by the CSA kernel in an optimized way for evaluating timing graphs.

Figure 5:
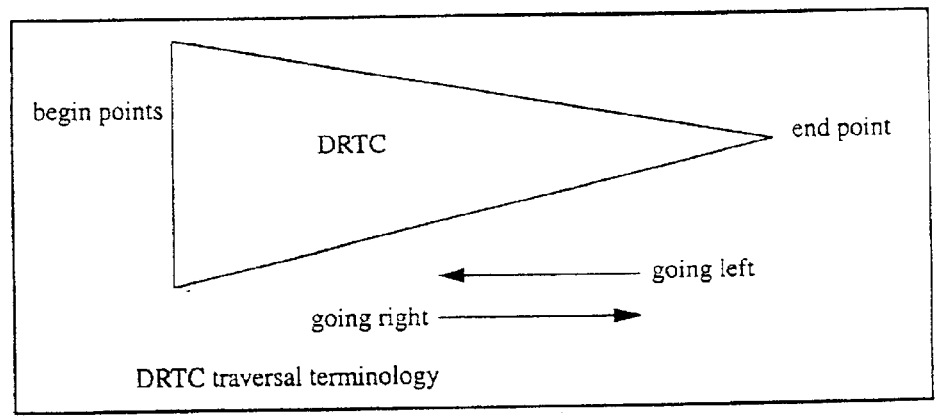
FIG. 5 is an illustration of a Domain Restricted Timing Cone (DRTC) including indications of going left or right.

The notion of going left or right is associated with a representation of the DRTC, as illustrated in FIG. 5. Going left (500) is from end point to begin points. Going right (510) is the opposite.

Table 1 provides an example programming structure for performing a DFS left edge iterator. As with all the example programming structures presented herein, Table 1 is not intended and a compilable or exectutable portion of code, but as an example programming structure that reflects a non-limiting implementation of a process or method consistent with the present invention.

TABLE 1

The DFS_Left_edge_iterator( sink_Vertex, dfs_action )
  sink_vertex->set visited( );
  for each edge whose sink vertex is sink-vertex
    dfs_action( edge );
    if (edge->source( )->not visited( ))
      DFS_Left_edge_iterator (edge->source( ), dfs_action);
    end if
  end for The dfs left iterator guarantees that all edges are visited once. Nothing more.

Table 2 provides an example programming structure for performing a BFS right edge iterator:

TABLE 2

The BFS_Right_edge_iterator (sink_vertex, bfs_action)
    sink_vertex->set_visited( );
    for each edge whose sink vertex is sink vertex
        if (edge->source( )->not visited( ))
            BFS_Right_edge_iterator(edge->source( ), bfs action);
        end if
        bfs_action( edge );
    end for The bfs right edge iterator guarantees that all edges are visited once. It also guarantees to call the bfs_action on each edge, and for any edge E, to call the bfs_action on E before calling the bfs_action on any edge located between the end point and E's sink.

Table 3 provides an example programming structure for performing a DFS left and BFS right edge iterator:

TABLE 3

The DFS_Left_BFS_Right_edge_iterator (sink_vertex, dfs_action, bfs_action)
    sink_vertex->set visited( );
    for each edge whose sink vertex is sink_vertex
        dfs_action( edge );
        if (edge->source( )->not visited( ))
            DFS_Left_BFS_Right_edge_iterator(edge->source( ),dfs_action,bfs_action);
        end if
        bfs_action( edge );
    end for In this example, the DFS_Left_BFS_Right_edge_iterator does dfs left and bfs right within only one DRTC traversal.

Table 4 provides an example programming structure for an allocation counter function:

TABLE 4

The alloc_counter function
    counter = get_counter( edge->source( ));
    if (!counter)
        counter = set_new_counter ( edge->source( ));
    end if
    counter->increment( );

The alloc counter function increments a counter on each edge source. This counter is initialized to "0" so it is used to count how many times the arc source is reached from the cone end point.

Table 5 provides an example programming structure for a BFS_Left_edge_iterator:

TABLE 5

The BFS_Left_edge_iterator(sink_vertex, bfs_right action, bfs_left_action)
    DFS_Left_BFS_Right_edge_iterator(sink_vertex, alloc_counter, bfs_right_action);
    BFS_Left_edge_iterator_body(sink_vertex, bfs_left_action);

The BFS_Left_edge_iterator performs a dfs_left_bfs_right DRTC traversal prior to doing the actual bfs left edge iterator. The dfs_left_bfs_right traversal is already described above and is used here to initialize a counter on each vertex (alloc_counter) and to execute the bfs_right action. The actual bfs left traversal is done in the BFS_Left_edge_iterator_body, and is using the counter set on each vertex to know how many times it has to reach a given vertex before continuing the traversal from this vertex. The bfs_left_action is called once for each edge; it is called on an edge after calling it on any edge between the edge sink and the end point.

Table 6 provides an example programming structure for the BFS_Left_edge_iterator_body:

TABLE 6

The BFS_Left_edge_iterator_body( sink_vertex, bfs_left_action )
    for each edge whose sink vertex is sink vertex
        bfs_left_action( edge );
        get_counter( edge->source( ) )->decrement( );
        if (get counter( edge->source( ) )->value( ) == 0 )
            BFS_Left_edge_iterator_body(edge->source( ), bfs left action);
        end if
    end for CSA Kernel Now that one is able to do DRTC traversal, let us look at the CSA kernel. The CSA computes the edge allocated budget:

$$\text{allocated\_budget(edge)} = \text{edge slack} * \text{local weight} / \text{total path weight}$$

While the local weight is a fixed value, the edge slack and the total path weight both depend on which path is considered. So, after considering all the paths, this should become:

$$\text{allocated budget(edge)} = \text{local weight} * \text{minimum(edge slack/total path weight)}$$

The CSA kernel is aiming at finding the value of the path of minimum "slack/weight" values for each edge, and the converging loop is converting it into an edge time by multiplying it by the local weight. The value path of minimum "slack/weight" value is called the Minimax_slack_to_weight.

The value computed by CSA_kernel is called CSA_slack_to_weight in the DRTC iterator skeleton. Several embodiments are illustrated herein, including:

1. CSA Kernel fast—provides a fast way to find an approximation of Minimax_slack_to_weight;

2. CSA kernel all pairs—a computation of Minimax_slack_to_weight;

3. CSA kernel minimax—Computes Minimax_slack to weight using less memory space; and 4. CSA kernel approximated pairs—The fourth embodiment is a possible alternate method which is a good compromise between memory space and approximation to Minimax_slack _to_weight.

In each of the different implementations, the algorithm first starts by computing the DRTC timing constraints. Since there is only one output, its required time is arbitrarily chosen to be a given constant, R. The arrival time Ai on each DRTC input is then chosen so that the difference R−Ai is equal to the most limited constraint between the considered input and the output. Table 7 provides an example programming structure for this step:

TABLE 7

```
compute_DRTC_timing_constraints( domains )
  constraint = infinity
  for each DRTC begin point
    for each domain in domains
      new_constraint = time(end_point,domain)-time(begin_point,domain)
      if new_constraint smaller than constraint
        constraint = new_constraint
      end if
    end for
  end for
if constraint is still set to infinity
  Ai = - infinity
else
  Ai = R - constraint
endif
```

First Embodiment for CSA Kernel (CSA Kernel Fast)

The data is now one DRTC, with the required time R on the output and the arrival time Ai on each input i. The budgets are computed through 2 traversals.

The first traversal is bfs left and is used to decorate each vertex with two values: time to end point (tte) and weight to end point (wte). The time to end point is the longest time to reach the end point from the current vertex. The weight to end point is the biggest sum of weight to reach the end point from the current vertex.

Figure 6:
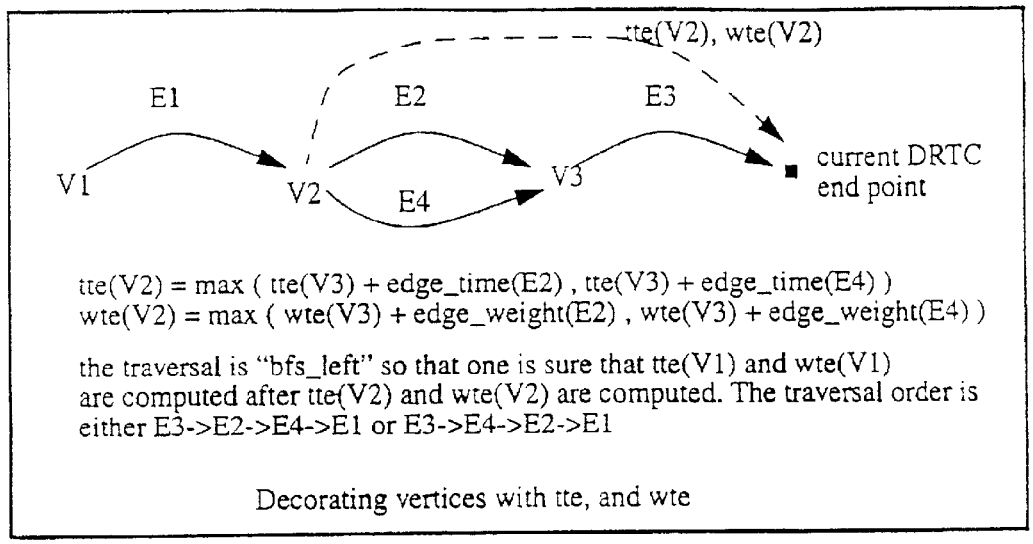
FIG. 6 is an illustration of decorated vertices.

Referring now to FIG. 6, vertices are "decorated" with tte and wte values. Calculations are performed such that:

$$tte(V2)=\max(tte(V3)+edge\_time(E2), tte(V3)+edge\_time(E4));$$
$$wte(V2)=\max(wte(V3)+edge\_weight(E2), wte(V3)+edge\_weight(E4));$$

The traversal is "bfs_left" so that one is sure that tte(V1) and wte(V1) are computed after tte(V2) and wte(V2) are computed. The traversal order is either E3→E2→E4→E1 or E3→E4→E2→E1.

The "tte" and "wte" decorator functions compute the tte and wte values for each traversed edge source by adding the edge time (weight) to the edge sink time (weight). Table 8 provides an example programming structure for these functions:

TABLE 8

```
tte_wte_decorator( edge )
    tte_sink = get_tte( edge->sink( ) );
    wte_sink = get_wte( edge->sink( ) );
    tte_source = get_tte( edge->source( ) );
    wte_source = get_wte( edge->source( ) );
    new_tte_source = tte_sink +
    static_timing_verifier->edge_time( edge );
    new_wte_source = wte_sink + get_weight( edge );
    if (new_tte_source > tte source) tte_source = new_tte_source;
    if (new_wte_source > wte_source) wte_source = new wte_source;
        set_tte( edge->source( ), tte_source):
        set_wte( edge->source( ), wte_source);
```

The second traversal is bfs right and is used to actually compute the smallest slack to weight on each edge. This value is computed through the following calculations:

$$slack\_to\_weight(edge)=remaining\_slack(edge)/remaining\text{-}weight(edge);$$

$$remaining\_slack(edge)=remaining\_time(edge\ source)\text{-}tte(edge\ sink)\text{-}edge\_time(edge);$$

$$remaining\text{-}weight(edge)=wte(edge\ sink)+edge\_weight(edge);$$

and $$remaining\_time(edge\ source)=R\text{-}arrival\_time(edge\ source).$$

The term arrival_time(edge source) is computed during this traversal. The arrival time is computed as follows in Table 8B:

TABLE 8B

```
new_arrival time = arrival_time(edge_source) +
edge_weight(edge)*slack_to_weight(edge)
if new_arrival_time greater than arrival_time(edge_sink)
   arrival_time(edge_sink) = new_arrival_time
end if
```

Since it is a BFS right traversal, the arrival time on an edge source is always computed before the edge is traversed, and then before it is needed to compute the edge sink arrival time.

Figure 7:
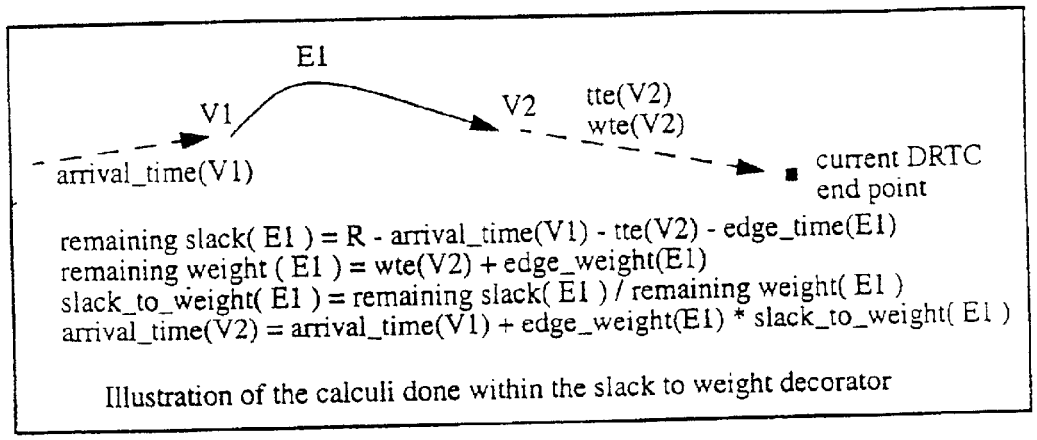
FIG. 7 is an illustration of an example calculation performed within a slack_to_weight_decorator function.

FIG. 7 provides an example illustration of calculation performed within a slack_to_weight_decorator function. The slack_to_weight_decorator calculations include:

$$Remaining\_slack(E1)=R\text{-}arrival\_time(V1)\text{-}tte(V2)\text{-}edge\_time(E1);$$

$$remaining\_weight(E1)=wte(V2)+edge\_weight(E1);$$

$$slack\_to\_weight(E1)=remaining\_slack(E1)/remaining\_weight(E1);$$

and $$arrival\_time(V2)=arrival\_time(V1)+edge\_weight(E1)*slack\_to\_weight(E1).$$

Table 9 provides an example programming structure for the slack_to_weight_decorator:

TABLE 9

```
slack_to_weight_decorator (edge)
    arr_sink = get_arr( edge->sink( ) );
    arr_source = get_arr( edge->source( ) );
    edge_time = static_timing_verifier->edge_time( edge);
    tte_source = get_tte( edge->sink( ) ) + edge_time;
    wte_source = get_wte( edge->sink( ) ) + get weight( edge);
    remaining-time = R - arr_source;
    slack_to_weight = (remaining-time - tte_source) / wte source;
    new_arr_sink = arr_source + get_weight( edge ) *
slack_to_weight;
    if (arr_sink < new_arr_sink) arr_sink = new_arr_sink;
    set_CSA_slack_to_weight( edge, slack-to-weight);
    set_arr( edge->sink( ), arr_sink);
```

And, table 10 provides an example programming structure for the CSA kernel:

TABLE 10

```
CSA_Kernel_fast( endpoint )
    set_tte( end_point, 0.);
    set wte( end_point, 0.);
    BFS_Left_edge_iterator( end_point,void,tte_wte_decorator );
    BFS_Right_edge_iterator( end_point,
    slack_to_weight_decorator);
```

Figure 8:
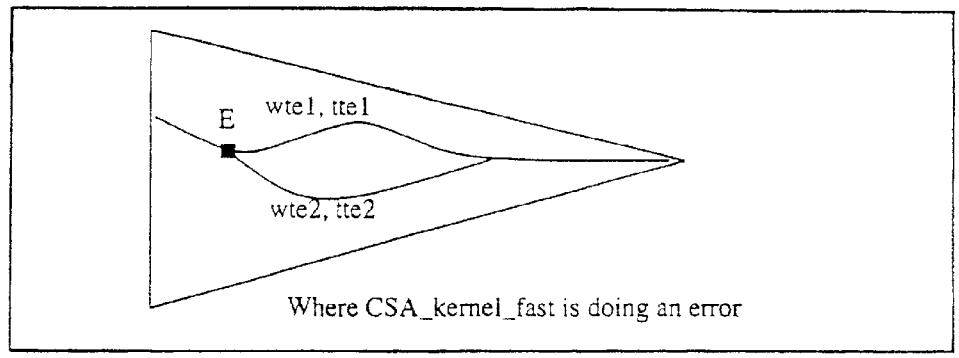
FIG. 8 is an illustration of an example set of re-converging edges.

The CSA_Kernel_fast is quite a good approximation for Minimax_slack_to_weight. It gives better results than IMP when the begin points and the end points times are very different from each other. Within a DRTC, CSA_Kernel_ fast accuracy is only reduced at reconverging edges. An example set of reconverging edges (edge 810, and edge 820) are illustrated in FIG. 8.

The Minimax_slack_to_weight is:

min((remaining_time−*tte*1)/*wte*1, (remaining_time−*tte*2)/*wte*2);

and the CSA slack_to_weight is:

(remaining_time−max(*tte*1, *tte*2))/max(*wte*1, *wte*2).

Second Embodiment for CSA Kernel (CSA Kernel All Pairs)

The idea in the second embodiment is to allocate exactly the Minimax slack_to_weight to each edge within a DRTC. The (tte,wte) pair which was annotated on each vertex is replaced by the list of all (tte, wte) pairs. The tte_wte_decorator and the slack_to_weight_decorator are then modified to operate on lists of pairs rather than on single pairs.

Table 11 provides an example programming structure for the tte_wte_decorator for CSA kernel all pairs:

TABLE 11 tte_wte_decorator( edge )
   for each (tte_sink,wte_sink) pair on edge sink
      tte sink = tte_sink + static_timing_verifier->edge_time( edge );
      wte_sink = wte sink + get_weight( edge );
      add_tte_wte-pair( edge->source( ), tte sink, wte_sink );
   end for And, table 12 provides an example programming structure for the slack_to_weight_decorator for CSA kernel all pairs:

TABLE 12 slack_to_weight_decorator( edge )
   arr_sink = get_arr( edge->sink( ) );
   arr_source = get_arr( edge->source( ) );
   remaining_time = R - arr_source;
   worst slack_to_weight = + oo
   latest arr source = R
   for each (tte_sink, wte_sink) pair on edge sink
      tte_source = tte_sink + static timing verifier->edge_time( edge );
      wte_source = wte_sink + get weight( edge );
      slack_to_weight = (remaining_time - tte_source) / wte_source;
         if (slack_to_weight < worst_slack_to_weight)
            worst_slack_to_weight = slack_to_weight
   latest_arr_source = arr_source + get weight( edge ) *
         slack_to_weight;
      end if
   end for
   if (latest_arr_source > arr_sink) arr_sink = latest_arr_source
   set_CSA_slack_to_weight( edge, worst_siack_to_weight);
   set_arr( edge->sink( ), arr_sink);
CSA_kernel all-pairs --> like CSA_Kernel_fast One issue with this new technique is that the memory used increases exponentially with the number of timing reconvergences encountered along the timing paths. It is then necessary to prune useless (tte,wte) pairs, which is done by the CSA kernel minimax function described in the third embodiment.

Third Embodiment for CSA Kernel (CSA Kernel Minimax)

The idea in the third embodiment is still to allocate exactly the Minimax_slack_to_weight to each edge within a DRTC, but to compare the (tte,wte) pairs and remove the ones that are proved to be useless. For a given edge, the slack_to_weight that is kept is the smallest one. Consider FIG. 9, two pairs (tte1,wte1) and (tte2,wte2), and draw the slack to weight value that is derived from them according to the remaining time (slack_to_weight=(remaining_time−tte)/wte).

Figure 9:
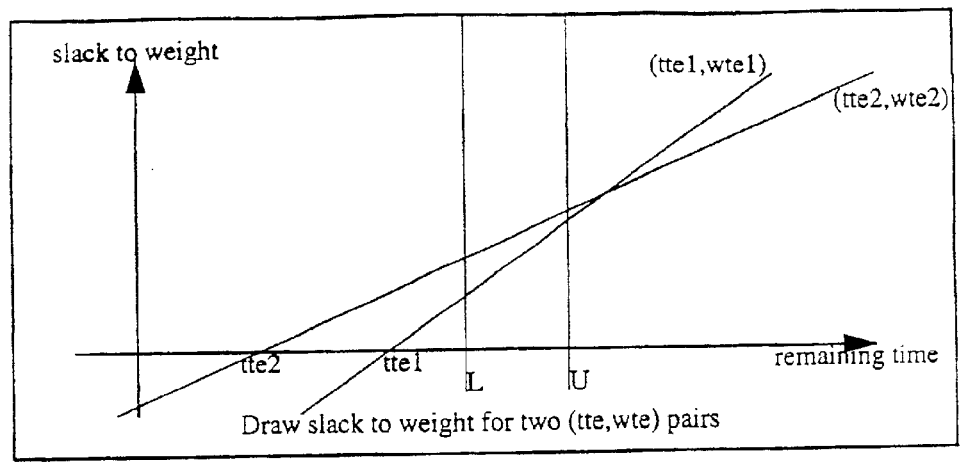
FIG. 9 is a graph illustrating slack to weight ratio for two pairs of tte and wte values.

If some bounds on the remaining time values can be computed, then one can compare the (tte,wte) pairs and eliminate those that never lead to the smallest slack to weight within the boundaries. In FIG. 9, if the valid remaining time values are those between the two vertical lines (L and U), then one can eliminate the (tte2,wte2) pair.

The bounds are computed through a first DRTC traversal. It is a good idea to take advantage of the DFS_Left_BFS_Right traversal that is automatically done in BFS_Left_edge_iterator itself called from CSA_kernel.

There are two bounds to compute, the upper bound U and the lower bound L. The remaining time from a given vertex is equal to "R−arrival_time(vertex)".

The upper bound is when arrival time(vertex) is as small as possible. The smallest arrival time is by doing a BFS Right propagation of arrival times from the inputs, propagating the minimum times rather than the maximum ones. This propagation is done with the edge times set at their minimum value, that is IT(edge).

The lower bound would be on the opposite with the biggest arrival time(vertex). The biggest arrival_time (vertex) is the value such that L−max(tte)=0. and then L=max(tte).

If L was larger than max(tte), it would not be possible to meet the required time set on the end point. There is a key property that is important in the choice of the L and U values: When L and U are chosen, some (tte,wte) pairs are eliminated. If they were not, they would lead to new (tte,wte) pairs when continuing the recursion towards the DRTC inputs. The property is that all these new pairs would be eliminated too. The elimination of these pairs reduces reconversions and reduces the amount of memory needed to allocate exactly the Minimax_slack_to_weight to each edge within a DRTC.

Figure 10:
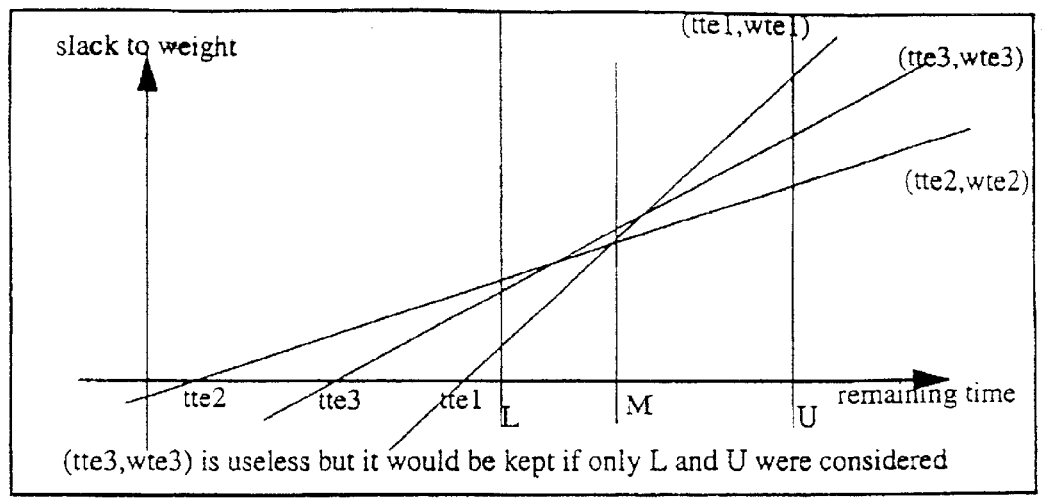
FIG. 10 is a graph illustrating slack to weight of tte wte pairs and an intersection point between two lowest s/w ratio tte wte pairs.

An additional embodiment is to attach an {L,U} pair to each (tte,wte) pair. So when two (tte,wte) pairs are kept, their line is crossing between the L and U bounds, say when remaining-time=M (see FIG. 10). The future pairs should then be compared to the first (tte,wte) pair between L and M, and to the second (tte,wte) pair between M and U. This helps eliminating pairs such as (tte3, wte3) as shown in FIG. 10.

The slack_to_weight_decorator is the same as in the second embodiment. The CSA_kernel and the tte_wte_decorator are changed. Table 13 provides an example programming structure for the tte_wte_decorator for CSA kernel minimax:

TABLE 13 tte_wte_decorator( edge )
   edge_sink = edge->sink( );
   edge_source = edge->source( );
   // first, compute the U and L bounds.
   L = O.;
   for each (tte_sink,wte_sink) pair on edge sink
   if (L < tte_sink) L = tte_sink;
   end for
   // the get_arr gets the minimum arrival time computed by
   min_arr_decorator
   U = R - get_arr( edge_sink );
   // now that the sink's U and L 8re known, one can remove the useless pairs
   // there are many ways to remove useless pairs. One way is to iterate on
   // the pairs, and compare the current pair to the pairs that are in
   // the useful pairs list.

TABLE 13-continued

```
// the result of the comparison is used to remove some pairs from the
// useful pairs list, and eventually to add the current pair in the list.
remove_useless_pairs( edge_sink );
// now all the remaining pafrs are useful.
for each useful (tte_sink, wte_sink) pair on edge sink
  edge_time = static_timing_verifier->edge_time( edge );
  new_tte_source = tte_sink + edge_time;
  new_wte_source = wte_sink + get_weight( edge);
  add_new_pair( edge_source, new_tte_source, new_wte_source);
end for
min_arr_decorator( edge )
  source_arr = get_arr( edge->source( ) );
  new_sink_arr = source_arr + static_timing_verifier->edge_time(
  edge );
  sink_arr = get_arr( edge->sink( ) );
  if (sink_arr > new_sink_arr) set_arr( edge->sink( ), new_sink_arr);
CSA_Kernel_minimax( end_point)
  set_tte( end_point, 0.);
  set_wte( end_point, 0.);
BFS_Left_edge_iterator(end_point,min_arr_decorator,
tte_wte_decorator
);
// removing the useless pairs on the cone's begin points is not
required.
// here it is done within the next 3 lines.
for each vertex that is a cone's begin point
  remove_useless_pairs( vertex );
        end for
BFS_Right_edge_iterator(end_point,slack_to_weight_decorator);
```

Fourth Embodiment for CSA Kernel (CSA Kernel Approximated Pairs)

The idea in the Fourth embodiment is to have a method that has a bounded number of stored (tte,wte) pairs. This method can be a used for a particular DRTC when the number of pairs is becoming too important, say greater than a predefined constant. In that case the previous method would return a failure, and the domain restricted timing cone iterator would then call the CSA_kernel_approximated_pairs instead.

Figure 11:
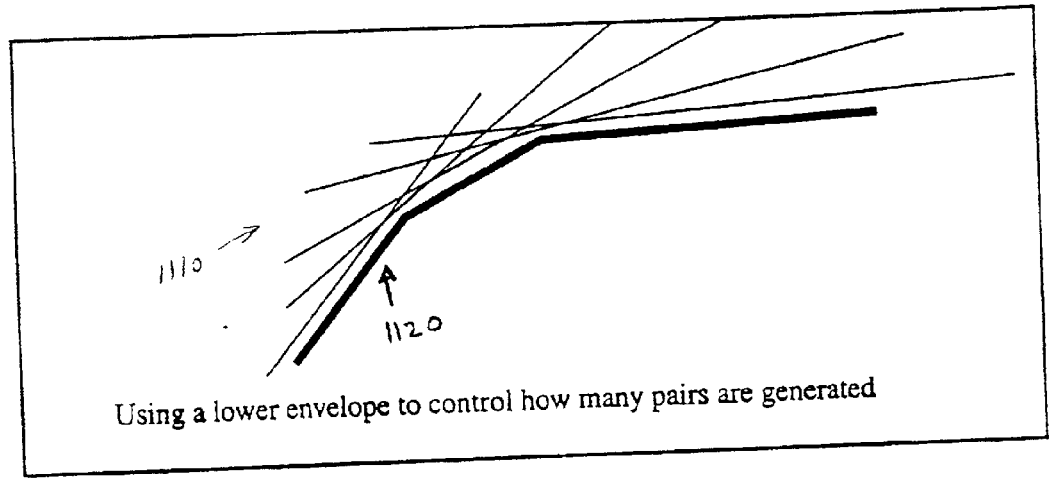
FIG. 11 is a graph illustrating an envelope that approximates a set of lowest slack to weight (s/w) ratio tte wte pairs.

The idea of the CSA_kernel_approximated_pairs is to store a limited number of segments that are as close as possible to the true envelope. Referring to FIG. 11, a set of tte,wte segments 1110 are shown that approximate a lower envelope 1120.

In this embodiment, there is no need to maintain a lower and an upper bounds. All pairs are considered and then replaced by a small list of pairs that approximate the lower envelope. The number of segments as well as the criterion to produce them can be changed easily while still doing a similar thing.

In this embodiment we want to protect the mechanism of computing all the pairs for a given vertex, and then replace them by a small number of pairs which approximate the envelope. This small number of pairs are then used in subsequent steps to generate the new considered pairs of the next visited vertices (note the previous description of adding the edge delay to the tte value, and the edgeweight to the wte value).

Domain Restricted Timing Cone Iterator

This iterator calls the CSA kernel on each domain restricted timing cone. After each call to the CSA kernel, it iterates through the edges that were in the domain restricted timing cone. For each considered edge, the slack to weight value found by CSA kernel is compared to the smallest one found so far. If the new value is smaller, it replaces the old one.

Table 14 provides an example programming structure for the DRTC iterator:

TABLE 14

```
DRTC_iterator( )
for each edge
  new_allocated_slack_to_weight(e) = + oo
end for
for each end point
  make new empty list_of_domains
  make new empty list_of_domains_with_exceptions
  for each timing domain
    if not
      static_timing_verifier->domain_has_timing_exceptions(domain)
    insert domain in list_of_domains
  else
    insert domain in list_of_domains_with_exceptions
    end if
  end for
  compute_DRTC_timing_constraints(list_of_domains)
  CSA_kernel( )
  for each edge in cone
    if CSA_slack_to_weight(e) < new_allocated_slack_to_weight(e)
      new_allocated_slack_to_weight(e) = CSA_slack_to_weight(e)
    end if
  end for
  for each domain in list_of_domains_with_exceptions
    make new empty list_of_domains
    insert domain in list_of_domains
    compute_DRTC_timing_constraints(list_of_domains)
    CSA_kernel( )
    for each edge in cone
      if CSA_slack_to_weight(e) < new_allocated_slack_to_weight(e)
        new_allocated_slack_to_weight(e) = CSA_slack_to_weight(e)
      end if
    end for
  end for
end for
```

In one embodiment, all the timing domains that do not have timing exceptions are treated by only one CSA_kernel run. This is achieved by computing a set of Ai times on the timing cone begin points, such that the value R−Ai for each begin point is equal to the most constraining R(domain)−Ai(domain) among all the domains which do not have the timing exceptions.

The only requirement is that within a given timing cone:
 there is one CSA_kernel run for all the timing domains with no exceptions;
 there is an additional CSA_kernel run for each timing domain with exceptions.

The CSA_kernel that is run for the domains with timing exceptions must also respect the exceptions. For example, a timing exception can be:
 "all the paths that go through a list of vertices are not constrained;" or
 "all the paths that go through a list of vertices have a different constraint value."

The BFS_right traversal that is made during CSA-kernel should actually be aware of those timing exceptions, and do the same accommodations that the static timing verifier is able to do, that is when the paths that go through a list of vertices are not constrained, CSA_kernel should be able to ignore those paths.

Converging Loop

The converging loop is basically doing four things:
1) It runs the static timing verification and decides whether to continue or stop looping. Looping is stopped when there is no slack to allocate anymore. It can also be stopped when some maximum number of passes has been done.
2) It sets to zero the weight of the edges which have a slack smaller than epsilon; epsilon is a predefined small number.

3) It runs the domain restricted timing cone iterator.

4) It adds the new allocated budgets to the edge time, so that the next call to the "compute-slacks" procedure of the static timing verifier can take them into account.

Table 15 provides an example programming structure for a converging loop:

TABLE 15

```
for each edge.
Static_timing_verifier->set edge_time(IT(e));
End
Loop
    static_timing_verifier->compute slacks( );
    slack_to_allocate = 0.;
    for each edge
        if (W(e)>0.)
            edge_slack = static_timing_verifier->edge_slack( edge );
            if (edge_slack > epsilon)
                if (edge_slack > slack_to_allocate)
                    slack_to_allocate = edge-slack;
                end if
            else
                W(e) = 0.;
            end if
        end if
    end for
    if (slack_to_allocate < epsilon) stop_loop;
    domain_restricted_timing_cone_iterator( );
    for each edge
        B(e) + = W(e) *new_allocated_slack_to_weight(e);
        static_timing_verifier->set edge_time(IT(e) + B(e));
    end for
end loop
```

Second Embodiment for the Converging Loop

When the third embodiment for the CSA_kernel succeeds for all DRTC's, the Minimax_slack_to_weight is then found for each net. There is still a source of error which resides in the iterative part of the algorithm, that is in the computation made by the converging loop at the steps:

$B(e) += w(e)*$new_allocated slack_to_weight$(e)$;

static_timing_verifier→set_edge_time$(IT(e)+B(e))$;

It is correct to do these two lines for the edges that are along a critical timing path, that is a timing path where the CSA slack_to_weight value is the same for all edges, and smaller or equal to the CSA slack-to-weight of all the incident and diverging timing paths: Along the critical timing paths, the edge slack is zero, and no more time needs to be allocated. For the other edges, these two lines are actually assigning a value that does not lead to an edge slack equal to 0., and the next converging loop iteration will use this value as the initial edge time. This leads to sub-optimalities again, and some edges are over constrained because of this mechanism. This phenomenon can be proved by looking at what is happening on a small test case.

The CSA_kernel_minimax procedure has the following property: At each pass at least one timing path is "fully" allocated, and its slack becomes 0.0. This can also be proved. By definition the minimax allocates weight(edge) *smallest path (slack/weight). So there is one path which has the smallest (slack/weight) among all the paths. Let's call this value SW. Along this path, all the edges are allocated weight(edge)*SW. By definition too, this path weight is equal to the sum of the edge weight along this path. So the sum over all the path edges of weight(edge)*SW=path weight*SW and then it is equal to path slack. In other words, on this path, all the initial slack is allocated in one pass, and then this path slack becomes "0" at the end of the pass.

Therefore, one H can make the following change to the converging loop: Add the CSA_kernel budget to the edge time if the edge_slack become null, otherwise do not add the CSA_kernel budget to the edge time.

It is necessary to add the CSA_kernel budgets to all the edges in order to compute the new edge slacks. So the converging loop is modified the following way: Add the CSA_kernel budgets to all the edges, then compute the new edge slacks, and then, for each edge: If the new edge slack is greater than zero (greater than a small number called epsilon), restore the preceding edge time on the edge (remove the CSA_kernel budget), otherwise keep the current edge time. This new algorithm gets rid of the errors due to iterations.

Table 16 provides an example programming structure for the second embodiment of the converging loop:

TABLE 16

```
The new skeleton is then:
    for each edge
        set_CSA_time( edge, IT (edge) );
        static_timing_verifier->set edge_time( edge, IT(edge) );
    end
    loop
        static_timing_verifier- >compute_slacks( );
        slack_to_allocate = 0.;
        for each edge
            if (W (edge) >0.)
                edge_slack = static_timing_verifier->edge_slack( edge );
                if (edge_slack > epsilon)
                    static_timing_verifier->set
                    edge_time(get_CSA_time(edge) );
                    if (edge_slack > slack-to-allocate)
                        slack-to-allocate = edge_slack;
                    end if
                else
                    set_CSA_time( edge, static_timing_verifier->
                    edge_time( edge) );
                    W(edge) = 0.;
                end if
            end if
        end for
        if (slack_to_allocate < epsilon) stop-loop;
        domain_restricted_timing_cone_iterator( );
        for each edge
            B(edge) + =
w(edge) *new_allocated_slack_to_weight(edge);
            static_timing_verifier->set edge_time( edge, IT(edge) + B(edge) );
        end for
    end loop
```

The "Reversed" CSA Kernel

It is possible to make an alternate embodiment for all the steps described herein, by just reversing the iterators, and the Timing Cone definition.

A "reversed" timing cone is defined by a begin point: The timing cone is the sub graph (within the current timing graph) that contains all the edges and vertices that are on a timing path starting at the begin point. The "left" iterators would then be replaced by "right" iterators starting at the begin point. The "right" iterators would be replaced by "left" iterators. The unique output required time R would be replaced by a unique arrival time A, and the input arrival time Ai would be replaced by the output required time Ri. The CSA kernel would then back propagate the required times to the begin point by subtracting the traversed edge times instead of propagating the arrival times to the end point by adding the traversed edge times.

Furthermore, based on the present disclosure, those skilled in the art will be able to present other mathematical models to describe timing graphs and perform other mathematical operations or methods that, although different than what is specifically described herein, are still consistent with the teachings of the present invention.

Figure 12:
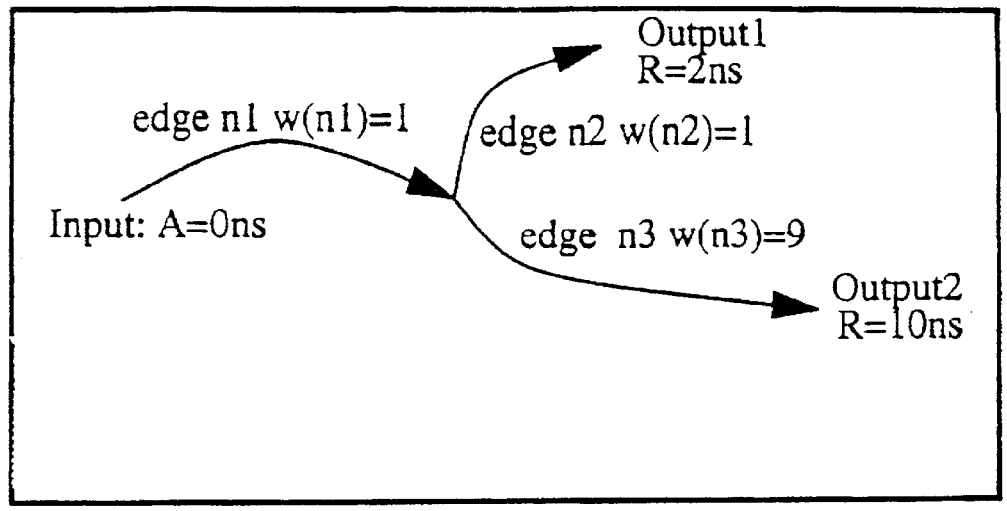
FIG. 12 is an example test case timing graph.

The present inventors have tested the methods and procedures described herein and the CSA algorithm (even with the CSA_Kernel_fast procedure) is producing time budgets that are closer to the expected ones than the state-of-art MIMP algorithm. Referring to FIG. 12, there is illustrated a test timing graph having a very basic pattern where IMP algorithm is producing errors.

In FIG. 12, the ideal delay budgets, as suggested by the weights, would be:

edge $n1$=1 ns, egde $n2$=1 ns, egde $n3$=9 ns

Instead, IMP algorithm is producing the following budgets:
first loop in converging loop→ edge $n1$=0.2 ns, egde $n2$=1 ns, egde $n3$=9 ns second loop in converging loop→ edge $n1$=0.28 ns, egde $n2$=1.4 ns, egde $n3$=9.72 ns third loop in converging loop→ edge $n1$=0.28 ns, egde $n2$=1.72 ns, egde $n3$=9.72 ns

The IMP family of algorithms needs 3 iterations to allocate all the slack on this very simple network, and (even worse), the budgets are not in accordance with the distribution suggested by the weights, and explicited above. On this same pattern, there are 2 DRTC (one DRTC from A to Output 1 and one DRTC from A to Output2), so let us see how well the CSA_Kernel_fast performs. The first loop in converging loop results in:

DRTC(Output1)→edge $n1$=1 ns, edge $n2$=1 ns;

DRTC(Output2)→edge $n1$=1 ns, edge $n3$=9 ns;

and edge $n1$=1 ns, edge $n2$=1 ns, edge $n3$=9 ns

One pass is enough to find the right numbers.

Figure 13:
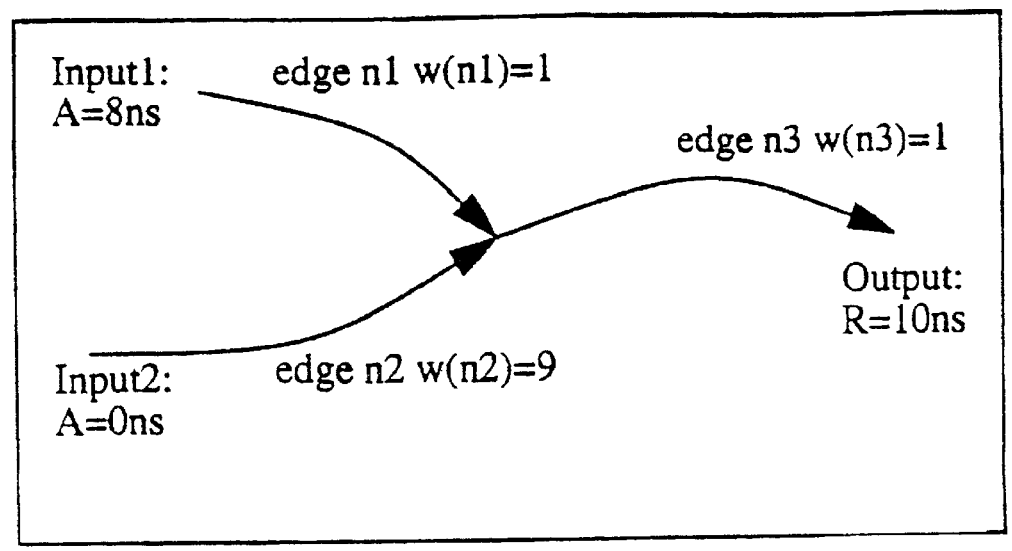
FIG. 13 is a second "dual" test case timing graph.

The same problem exists in the "dual" test case shown in FIG. 13. After three loops MIMP is finding:

edge $n1$=1.72 ns, edga $n2$=9.72 ns, edge $n3$=0.28 ns instead of the expected $n1$=1 ns, edge $n2$=9 ns, edge $n3$=1 ns.

Again, CSA_Kernel_fast is producing the right budgets on the first pass. This is because MIMP is using the Minimax-Pert scheme:

$B$(edge)=$W$(edge)*min(edge slack)/max(path weight).

At each timing path divergence or convergence the term min(edge slack) may come from one branch, while the term max(path weight) may come from another branch.

The present invention propoes several approaches, including:

1. CSA_Kernel_fast is also doing some kind of Minimax-Pert simplification, but it is minimizing this source of error by considering one DRTC at a time. The term min(slack edge) has a larger probability to be from the same branch as the term max(path weight) because all the considered paths are going to the same unique output, so the target required time is the same for all the considered paths.

2. CSA_kernel_minimax is not doing any Minimax-Pert simplification and is very faithful to the weights.

3. CSA_kernel_approximated_pairs is doing a very good job at approximating the CSA_kernel_minimax without potentially using too much memory.

Preferably, only the second embodiment of the converging loop is used with the CSA_kernel_minimax. Finally, by associating the second embodiment of the converging loop with CSA_kernel_minimax, one gets the required time budgets, with no error.

In both embodiments of the converging loop, it is also possible to change the value of the local weight. As described above, the converging loop resets the weight to "0" if the slack is null, and the weight is not changed otherwise. However, alternatively, a new value may be computed.

Although the present invention has been described mainly from the standpoint of budgeting constraints that set an upper limit to the path delays (i.e., "late" constraints-path delays must be less than the given limits), the present invention may also be applied to "early" constraints. The early constraints are setting a lower limit to the path delays: the path delays must be greater than the given limits.

The tte becomes the shortest time to reach the endpoint, but wte is still the largest sum of weight. One is still computing the smallest slack to weight ratio. The early arrival time is computed like the late arrival time (discussed above), but the computation is for the earliest arrival time as shown below:

early_remaining_slack(edge)=earlyR−early_arrival_time (edge_source) −early_tte(edge_source)−edge_time (edge), where early_tte is the shortest time to end point;
remaining_weight(edge)=wte(edge_sink)+edge_weight (edge), where remaining_weight is the same as late case;
early_slack_to_weight(edge)=early_remaining_slack (edge)/remaining_weight(edge);
new_early_arrival_time=early_arrival_time(edge source)+edge_weight(edge)*early_slack_to_weight (edge); and
if new_early_arrival_time SMALLER than early_ arrival_time(edge_sink) early_arrival_time(edge_ sink)=new_early_arrival_time end if Since it is a BFS right traversal, the arrival time on an edge source is computed before the edge is traversed, and then before it is needed to compute the edge sink arrival time. The other embodiments for the early cases are the same because it is still the smallest slack to weight that is considered. So the (early_tte,wte) pairs that are selected are those that do the lower envelope like for the late case.

Now, referring back to the positive (decrease positive slack till null) and negative (increase negative slack till null) modes discussed previously and considering early or late constraints, when in late positive mode, the description for L and U calculation is correct:

L=max tte; and

U=R−smallest possible arrival time.

The "max tte" and the "smallest possible arrival time" are computed using the actual timing arc delay because the actual delay may only be increased causing L and U to be closer to each other.

When in late negative mode:

U=max tte;

L=R−biggest possible arrival time. In the negative mode, the goal is to decrease the arc delays. So U is when all the negative slack is already allocated on the left, and U−max tte=0 => U=max tte; and L is when no negative delay was allocated at all on the left, and R−L=biggest arrival time.

In early mode, there is a subtle difference when compared with late mode:

(1) the arc delays are increased until the negative slack becomes null: the slack is negative when the delays are too small; and (2) the arc delays are decreased until the positive slack becomes null: the slack is positive when the delays are too large.

But this subtle difference does not turn into a difference in the L and U bounds calculation.

When in positive early mode (so the early slack is negative):

L=max tte, and it is the max tte taken from the list of late tte, not from the list of early tte;

U=earlyR−smallest possible arrival time like for late case, L is when all positive delay is already allocated on the left. When in negative early mode (so the early slack is positive);

L=R−biggest possible arrival time; and

U=max tte.

As will be apparent to an ordinarily skilled practitioner in the art, other changes to the example programming structures contained herein may also be made to accommodate differences in calculating the early constraints and still remain within the scope and spirit of the disclosure presented herein.

Although the present invention has been described herein with reference to circuits and timing graphs representing circuits, the devices and processes of the present invention may be applied to other areas, including mechanical or other systems that may be appropriately described in a timing graph or other mathematical relationship (e.g., model of a physical system) on which the present invention may be performed.

The present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art.

The present invention includes a computer program product which is a storage medium (media) having instructions stored thereon/in which can be used to control, or cause, a computer to perform any of the processes of the present invention. The storage medium can include, but is not limited to, any type of disk including floppy disks, mini disks (MD's), optical discs, DVD, CD-ROMS, micro-drive, and magneto-optical disks, ROMs, RAMs, EPROMs, EEPROMS, DRAMs, VRAMs, flash memory devices (including flash cards), magnetic or optical cards, nanosystems (including molecular memory ICs), RAID devices, remote data storage/archive/warehousing, or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Ultimately, such computer readable media further includes software for performing the present invention, as described above.

Included in the programming (software) of the general/specialized computer or microprocessor are software modules for implementing the teachings of the present invention, including, but not limited to, performing timing graph searches, iteratively examining DRTCs of a timing graph, including calculating edge slacks, weights, slack to weight ratios, and budgets, identifying one or more wte/tte pairs for each vertex in the timing graph, eliminating useless wte/tte pairs via identification of lowest slack/weight ratio of wte/tte pairs between upper and lower bounds and/or the use of a lowest slack to weight ratio envelope or an equation describing a calculated or estimated lowest slack/weight ratio, and the display, storage, or communication of results according to the processes of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A method of slack allocation within a timing graph, comprising the steps of:

setting an initial edge time for each edge in the timing graph;

setting a weight value for each edge in the timing graph; and iteratively performing the following steps:

computing an amount of the available slack to be budgeted to each edge of the graph;

for each edge having a weight greater than zero, if the computed slack is greater than a predetermined epsilon, then restore the edge time to that in an immediately preceding iteration, and if the computed slack is less than or equal to the predetermined epsilon, then saving a current edge time and setting a weight of the edge to zero;

stopping the iterative steps if an amount of slack to allocate is less than the predetermined epsilon;

determining a new budget for each edge; and incrementing the edge time for each edge by the corresponding new budget;

until the iterative steps are stopped or a maximum number of iterations is performed.

2. The method according to claim 1, wherein said step of determining a new budget comprises:

performing a timing cone analysis on domain restricted timing cones within the timing graph to determine a slack-to-weight ratio for each edge; and increasing the edge time for each edge by an amount equal to a weight of each edge multiplied by the determined slack-to-weight ratio for that edge.

3. The method according to claim 1, wherein said timing graph is a set of vertices and edges representative of timing of an electrical circuit.

4. The method according to claim 1, wherein said timing graph is a set of vertices and edges representative of a model of a physical system.

5. A method for performing analysis on a set of domain restricted timing cones, comprising the steps of:

selecting a domain restricted timing cone;

determining a slack to weight ratio for each edge in the domain restricted timing cone;

for each edge, if the determined slack to weight ratio for an edge is less than a current slack to weight ration for that edge, then, replacing the current slack to weight ratio with the current slack to weight ratio;

selecting a next domain restricted timing cone and repeating said steps of determining and replacing until each timing cone has been analyzed.

6. The method according to claim 5, further comprising the step of initially setting each slack to weight ration to a large value.

7. The method according to claim 6, wherein said large value is infinity.

8. The method according to claim 5, further comprising the step of excluding timing domains having exception from analysis until the non excepted timing domains have been analyzed.

9. A method of computing a time budget for each edge in a Domain Restricted Timing Cone (DRTC) that can be represented in a graph, comprising the steps of:

determining timing constraints including a required output time (R) for an endpoint of the DRTC and an arrival time (Ai) for each input (i) of the DRTC;

decorating each vertex in the graph with a time to endpoint (tte) value and a weight to endpoint (wte) value;

computing a smallest slack to weight on each edge of the graph within the DRTC using the tte and wte pair for each edge.

10. The method according to claim 9, wherein tte represents a longest time to reach the endpoint and wte represents a largest sum of weight to reach the endpoint.

11. The method according to claim 9, wherein said step of decorating each vertex comprises:

traversing the graph in the DRTC in a breadth first search (bfs).

12. The method according to claim 9, wherein said step of computing a smallest slack to weight on each edge comprises:

traversing the graph in the DRTC in a breadth first search (bfs) and computing a slack to weight ratio for each edge.

13. The method according to claim 12, wherein:

said slack to weight ratio for each edge is calculated by computing a remaining_slack (edge) divided by a remaining weight (edge);

remaining_slack=remaining time(edge_source)-tte (edge sink)-edge_time(edge);

remaining_slack(edge)=remaining_time(edge source)-tte (edge sink)-edge_time(edge);

remaining-weight(edge)=wte(edge sink)+edge_weight (edge); and remaining_time(edge source)=R-an arrival_time(edge source).

14. The method according to claim 9, wherein said arrival time (Ai) is computed according to:

setting new Ai=Ai(edge_source)+edge_weight(edge) *slack_to_weight (edge); and if Ai(new) is greater than Ai (edge_sink), then setting Ai(edge sink)=new Ai.

15. The method according to claim 9, wherein said step of determining timing constraints comprises:

setting the output time at an arbitrary value; and choosing an arrival time (Ai) for each input such that R-Ai is equal to a most constraining constraint imposed between the input Ai and the endpoint.

16. The method according to claim 9, wherein:

said step of decorating comprises decorating each vertex in the graph with a set of time to endpoint (tte) and weight to endpoint (wte) pairs representing a time to reach and the endpoint and weight to reach the endpoint for each path from the vertex to the endpoint; and said step of computing comprises computing a smallest slack to weight on each edge of the graph within the DRTC using the tte and wte pairs.

17. The method according to claim 16, further comprising the step of:

removing wte and tte pairs that are not part of a smallest slack to weight ratio for any path from the vertex to the endpoint.

18. The method according to claim 17, wherein:

said step of removing wte and tte pairs comprises, setting an upper and lower bounds representing a valid range for comparing wte and tte pairs, and removing wte and tte pairs not having a lowest value within said upper and lower bounds.

19. The method according to claim 18, wherein said step of removing wte and tte pairs further comprises plotting a graph of each wte and tte pair on a slack to weight vs remaining time grid.

20. The method according to claim 17, wherein:

said step of removing wte and tte pairs comprises, setting an upper (U) and lower (L) bounds representing a valid range for comparing wte and tte pairs, finding a first wte and tte pair having a lowest slack to weight within the upper and lower bounds;

finding a second wte and tte pair having a lowest slack to weight within the upper and lower bounds;

determining an intersection point (M) between the first and second wte and tte pairs; and comparing the remaining wte and tte pairs to said first wte and tte pairs between L and M, and to said second wte and tte pair between M and U.

21. The method according to claim 17, wherein:

said step of removing wte and tte pairs comprises, setting an upper and lower bounds representing a valid range for comparing wte and tte pairs, finding a set of wte and tte pairs having a lowest slack to weight within the upper and lower bounds;

determining intersection points (M1, M2, . . . Mn) between at a lowest slack to weight intersection of the lowest slack to weight wte and tte pairs;

removing the remaining wte and tte pair if the slack to weight ratio is not lower than the slack to weight ratio of any of the lowest slack to weight pairs between intersection points of other lowest slack to weight pairs representing a boundary of lowest slack to weight values between and said upper and lower bounds.

22. The method according to claim 21, wherein:

said step of removing wte and tte pairs further comprises the step of adding remaining wte and tte pairs to the set of lowest slack to weight pairs if the remaining wte and tte pair has a lower slack to weight ratio compared to any of the lowest slack to weight pairs between intersection points of other lowest slack to weight pairs and said upper and lower bounds.

23. The method according to claim 22, further comprising the steps of:

modeling an equation using the lowest slack to weight pairs that represents a boundary of lowest slack to weight values between and said upper and lower bounds; and using the modeled equation to determine if remaining slack to weight pairs should be included in the set of lowest slack to weight pairs.

24. The method according to claim 22, further comprising the steps of:

if the number of slack to weight pairs to evaluate reaches a predetermined threshold, then, establishing an envelope comprising a limited number of segments that follow a terrain of the lowest slack to weight pairs; and rejecting any additional slack to weight pairs if the slack to weight of the additional pair is outside the established envelope.

25. he method according to claim 17, wherein said computer instruction are compiled computer instructions stored as an executable program on said computer readable media.

26. The method according to claim 9, wherein:

said method is embodied in a set of computer instructions stored on a computer readable media;

said computer instructions, when loaded into a computer, cause the computer to perform the steps of said method.

27. The method according to claim 9, wherein said method is embodied in a set of computer readable instructions stored in an electronic signal.

28. The method according to claim 9, wherein tte represents a shortest time to reach the endpoint and wte represents a largest sum of weight to reach the endpoint.

29. The method according to claim 9, wherein said step of computing a smallest slack to weight comprises:

maintaining a list of (wte, tte) pairs;

determining a lower (L) bounds and upper (U) bounds of timing to evaluate the pairs;

determining intersection points (Ml, M2, ... Mn) between at a lowest slack to weight intersection of the lowest slack to weight wte and tte pairs;

removing pairs that do not lead to a smallest absolute value slack to weight ratio; and computing the smallest slack to weight ration based on the remaining pairs.

30. The method according to claim 29, wherein said (wte, tte) pairs, L and U, and intersection points are for an early case.

31. The method according to claim 29, wherein said (wte, tte) pairs, L and U, and intersection points are for a negative delay allocation case.

* * * * *